US011391682B2

(12) United States Patent
Tsutsumi et al.

(10) Patent No.: US 11,391,682 B2
(45) Date of Patent: Jul. 19, 2022

(54) AUGER ELECTRON MICROSCOPE AND ANALYSIS METHOD

(71) Applicant: JEOL Ltd., Tokyo (JP)

(72) Inventors: Kenichi Tsutsumi, Tokyo (JP); Tatsuya Uchida, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/177,376

(22) Filed: Feb. 17, 2021

(65) Prior Publication Data
US 2021/0255124 A1 Aug. 19, 2021

(30) Foreign Application Priority Data

Feb. 18, 2020 (JP) .............................. JP2020-025124

(51) Int. Cl.
*G01N 23/2276* (2018.01)
*H01J 37/28* (2006.01)

(52) U.S. Cl.
CPC .......... *G01N 23/2276* (2013.01); *H01J 37/28* (2013.01); *G01N 2223/418* (2013.01);
(Continued)

(58) Field of Classification Search
CPC .......... G01N 23/2276; G01N 2223/418; H01J 37/28; H01J 2237/24564; H01J 2237/2511
See application file for complete search history.

(56) References Cited

U.S. PATENT DOCUMENTS 8,346,521 B2 * 1/2013 Statham ............. G01N 23/2252
378/53
2002/0145111 A1 * 10/2002 Klyachko ............ G01N 23/227
250/307
(Continued)

FOREIGN PATENT DOCUMENTS

JP H11316202 A 11/1999
JP 200820386 A 1/2008
(Continued)

OTHER PUBLICATIONS

Extended European Search Report issued in EP21155520.6 dated Jun. 30, 2021.
(Continued)

*Primary Examiner* — David A Vanore
(74) *Attorney, Agent, or Firm* — The Webb Law Firm

(57) ABSTRACT

An Auger electron microscope includes a processing unit, and the processing unit performs processing of: acquiring an actually measured Auger spectrum obtained by measuring a test specimen containing an analysis target element; acquiring a plurality of first standard Auger spectra obtained by measuring a plurality of standard specimens each containing the same analysis target element but in different chemical states; calculating, based on a test specimen measurement condition that is a measurement condition when the test specimen has been measured and a standard specimen measurement condition that is a measurement condition when the standard specimens have been measured, a plurality of second standard Auger spectra under the test specimen measurement condition from the plurality of first standard Auger spectra; and performing curve fitting calculation of the actually measured Auger spectrum by using the plurality of calculated second standard Auger spectra.

7 Claims, 4 Drawing Sheets

(52) U.S. Cl.
CPC ............. *H01J 2237/24564* (2013.01); *H01J 2237/2511* (2013.01)

(56) References Cited

U.S. PATENT DOCUMENTS

| | | | | |
|---|---|---|---|---|
| 2013/0105687 | A1* | 5/2013 | Cubric | H01J 49/482 |
| | | | | 250/305 |
| 2017/0067837 | A1* | 3/2017 | Shima | G01N 23/2273 |
| 2020/0111197 | A1* | 4/2020 | Uchida | G06T 7/40 |
| 2021/0082660 | A1* | 3/2021 | Tsutsumi | H01J 37/1474 |
| 2021/0096063 | A1* | 4/2021 | Tsutsumi | G01N 23/2206 |
| 2021/0098244 | A1* | 4/2021 | Uchida | H01J 37/153 |
| 2021/0255124 | A1* | 8/2021 | Tsutsumi | H01J 37/28 |

FOREIGN PATENT DOCUMENTS

| | | |
|---|---|---|
| JP | 201753639 A | 3/2017 |
| JP | 2017111022 A | 6/2017 |

OTHER PUBLICATIONS

Machine English-language translation of JP2008020386A, which was cited in the IDS filed on Feb. 17, 2021.
Office Action issued in JP2020025124 dated Jan. 11, 2022.

* cited by examiner

| ABSOLUTE INTENSITY RATIO (%) OF STANDARD AUGER SPECTRA (ABUNDANCE RATIO OF EACH MOLECULE) | | | ATOMIC CONCENTRATION (%) | | | |
|---|---|---|---|---|---|---|
| Fe | FeO | $Fe_2O_3$ | Fe | $Fe^{2+}$ | $Fe^{3+}$ | $O^{2-}$ |
| 1.05 (RED RUST) | 46.74 | 52.21 | 1.1 | 23.4 | 20.9 | 54.6 |

| name | Mag. | Atomic% |
|---|---|---|
| Sn | 0.1202 | 12.0 |
| SnO | 0.9269 | 46.3 |
| SnO2 | 0.0000 | 0.0 |

AUGER ELECTRON MICROSCOPE AND ANALYSIS METHOD

CROSS-REFERENCE TO RELATED APPLICATION

This application claims priority to Japanese Patent Application No. 2020-025124 filed Feb. 18, 2020, the disclosure of which is hereby incorporated by reference in its entirety.

BACKGROUND OF THE INVENTION

Field of the Invention

The present invention relates to an Auger electron microscope (AES) and an analysis method.

Description of Related Art

An Auger electron microscope can perform analysis of a chemical state. Also, the Auger electron microscope can perform quantitative analysis.

In a method generally used in quantitative analysis using Auger electron spectroscopy, relative values, which are obtained by standardizing values obtained by dividing peak intensities of all detected elements by a relative sensitivity factor of each element, are used as element concentrations.

In an Auger spectrum, a peak intensity of each element is represented by a difference between a maximum value and a minimum value of a differential peak (a Peak-to-Valley), rather than a peak area that is generally used. The difference between the maximum value and the minimum value of the differential peak changes greatly due to not only an element concentration but also a change in shape because of a change in chemical state and a change in shape when a plurality of peaks are superimposed on each other.

For that reason, in JP-A-2008-20386, curve fitting calculation is performed using a plurality of standard Auger spectra, obtained by measuring a plurality of standard specimens containing analysis target elements having different chemical states from each other, for differential Auger spectra of analysis target elements. In this curve fitting calculation, not only a chemical state ratio but also a quantitative value can be obtained from each coefficient multiplied by the plurality of standard Auger spectra.

In the analysis method disclosed in JP-A-2008-20386, the Auger spectra of the standard specimens measured under the same measurement conditions as those of Auger spectra of test specimens are used as standard Auger spectra used for the curve fitting calculation. For that reason, in the analysis method disclosed in JP-A-2008-20386, the standard Auger spectra have to be prepared by measuring the standard specimens under the same measurement conditions as those of the test specimens in accordance with the measurement conditions of the test specimens.

SUMMARY OF THE INVENTION

According to a first aspect of the invention, there is provided an Auger electron microscope including:

a measuring unit that performs measurement by Auger electron spectroscopy; and a processing unit that analyzes Auger spectra obtained by the measuring unit, the processing unit performing processing of:

acquiring an actually measured Auger spectrum obtained by measuring a test specimen containing an analysis target element;

acquiring a plurality of first standard Auger spectra obtained by measuring a plurality of standard specimens each containing the same analysis target element but in different chemical states;

calculating, based on a test specimen measurement condition that is a measurement condition when the test specimen has been measured and a standard specimen measurement condition that is a measurement condition when the standard specimens have been measured, a plurality of second standard Auger spectra under the test specimen measurement condition from the plurality of first standard Auger spectra; and performing curve fitting calculation of the actually measured Auger spectrum by using the plurality of calculated second standard Auger spectra.

According to a second aspect of the invention, there is provided an analysis method including:

acquiring an actually measured Auger spectrum obtained by measuring a test specimen containing an analysis target element;

acquiring a plurality of first standard Auger spectra obtained by measuring a plurality of standard specimens each containing the same analysis target element but in different chemical states;

calculating, based on a test specimen measurement condition that is a measurement condition when the test specimen has been measured and a standard specimen measurement condition that is a measurement condition when the standard specimens have been measured, a plurality of second standard Auger spectra under the test specimen measurement condition from the plurality of first standard Auger spectra; and performing curve fitting calculation of the actually measured Auger spectrum by using the plurality of calculated second standard Auger spectra.

DESCRIPTION OF THE INVENTION

Figure 1:
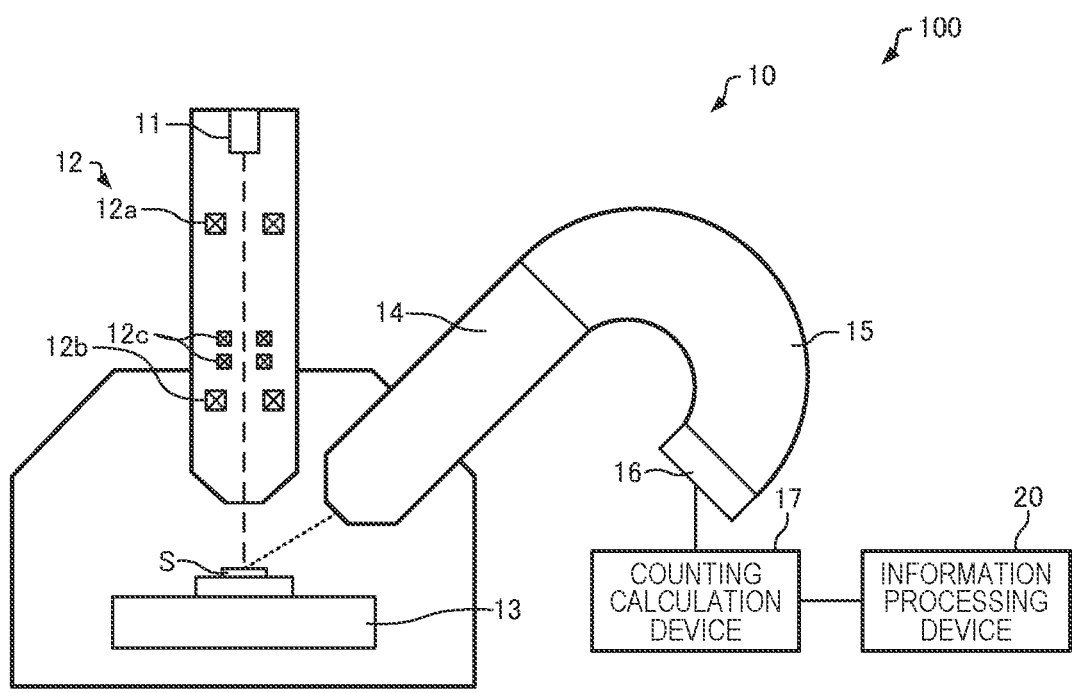
FIG. 1 is a diagram illustrating a configuration of an Auger electron microscope according to an embodiment of the invention.

An Auger electron microscope according to an embodiment of the invention includes:

a measuring unit that performs measurement by Auger electron spectroscopy; and a processing unit that analyzes Auger spectra obtained by the measuring unit, the processing unit performing processing of:

acquiring an actually measured Auger spectrum obtained by measuring a test specimen containing an analysis target element;

acquiring a plurality of first standard Auger spectra obtained by measuring a plurality of standard specimens each containing the same analysis target element but in different chemical states;

calculating, based on a test specimen measurement condition that is a measurement condition when the test specimen has been measured and a standard specimen measurement condition that is a measurement condition when the standard specimens have been measured, a plurality of second standard Auger spectra under the test specimen measurement condition from the plurality of first standard Auger spectra; and performing curve fitting calculation of the actually measured Auger spectrum by using the plurality of calculated second standard Auger spectra.

In such an Auger electron microscope, since the processing unit calculates the second standard Auger spectra under the test specimen measurement condition from the first standard Auger spectra under the standard specimen measurement condition, the curve fitting calculation can be performed even in a case in which the measurement condition of the actually measured Auger spectrum and the measurement condition of the standard Auger spectra are different from each other.

An analysis method according to an embodiment of the invention includes:

acquiring an actually measured Auger spectrum obtained by measuring a test specimen containing an analysis target element;

acquiring a plurality of first standard Auger spectra obtained by measuring a plurality of standard specimens each containing the same analysis target element but in different chemical states;

calculating, based on a test specimen measurement condition that is a measurement condition when the test specimen has been measured and a standard specimen measurement condition that is a measurement condition when the standard specimens have been measured, a plurality of second standard Auger spectra under the test specimen measurement condition from the plurality of first standard Auger spectra; and performing curve fitting calculation of the actually measured Auger spectrum by using the plurality of calculated second standard Auger spectra.

In such an analysis method, since the step of calculating the second standard Auger spectra under the test specimen measurement condition from the first standard Auger spectra under the standard specimen measurement condition is included, the curve fitting calculation can be performed even in a case in which the measurement condition of the actually measured Auger spectrum and the measurement condition of the standard Auger spectra are different from each other.

Preferred embodiments of the invention are described in detail below with reference to the drawings. It is noted that the following embodiments do not unduly limit the scope of the invention as stated in the claims. In addition, all of the elements described in the following embodiments are not necessarily essential requirements of the invention.

1. Auger Electron Microscope

First, an Auger electron microscope according to an embodiment of the invention will be described with reference to the figures. FIG. 1 is a diagram illustrating a configuration of an Auger electron microscope 100 according to an embodiment of the invention.

The Auger electron microscope 100 is a device that performs measurement using Auger electron spectroscopy and performs analysis of an Auger spectrum obtained as a result of the measurement. The Auger electron spectroscopy is a method of performing analysis of an element by measuring energy of Auger electrons that are excited by an electron beam or the like and emitted from a specimen.

As illustrated in FIG. 1, the Auger electron microscope 100 includes a measuring unit 10 and an information processing device 20.

The measuring unit 10 performs measurement using Auger electron spectroscopy. The measuring unit 10 includes an electron source 11, an optical system 12, a specimen stage 13, an input lens 14, an electron spectroscope 15, a detector 16, and a counting calculation device 17.

The electron source 11 generates an electron beam. The electron source 11 is, for example, an electron gun that accelerates electrons emitted from a cathode with an acceleration voltage applied between the cathode and an anode to emit an electron beam.

The optical system 12 radiates the electron beam emitted from the electron source 11 to a specimen S. The optical system 12 includes a focusing lens 12a, an objective lens 12b, and a deflector 12c.

The focusing lens 12a and the objective lens 12b focus the electron beam emitted from the electron source 11. By the focusing lens 12a and the objective lens 12b focusing the electron beam emitted from the electron source 11, an electron probe can be formed. The focusing lens 12a and an aperture (not shown) can control a radiation current, which is a current flowing in the electron probe radiated to the specimen S.

The deflector 12c deflects the electron beam focused by the focusing lens 12a and the objective lens 12b. The deflector 12c can radiate the electron beam at an arbitrary position on the specimen S. Further, the deflector 12c can scan the specimen S with the electron beam.

The specimen stage 13 holds the specimen S. The specimen stage 13 includes a horizontal moving mechanism for moving the specimen S in a horizontal direction, a height direction moving mechanism for moving the specimen S in a height direction, and a tilting mechanism for tilting the specimen S. The specimen S can be positioned by the specimen stage 13.

The input lens 14 takes in the Auger electrons emitted from the specimen S and guides them to the electron spectroscope 15. For example, energy resolution can be made variable by decelerating the electrons with the input lens 14. In the input lens 14, the resolution increases as the electrons are decelerated, but sensitivity decreases.

The electron spectroscope 15 analyzes the Auger electrons generated from the specimen S by irradiating the specimen S with the electron beam. The electron spectroscope 15 is, for example, an electrostatic hemispherical analyzer.

The electron spectroscope 15 has an inner hemispherical electrode and an outer hemispherical electrode. In the electron spectroscope 15, by applying a voltage between the inner hemispherical electrode and the outer hemispherical electrode, electrons within an energy range corresponding to the applied voltage can be extracted. The detector 16 detects the electrons analyzed by the electron spectroscope 15.

The counting calculation device 17 counts the electrons detected by the detector 16 for each energy. The number of electrons counted in a unit time in the counting calculation device 17 corresponds to an intensity. The Auger spectrum can be obtained from counting results of the electrons in the counting calculation device 17. The counting results in the counting calculation device 17 are sent to the information processing device 20.

Figure 2:
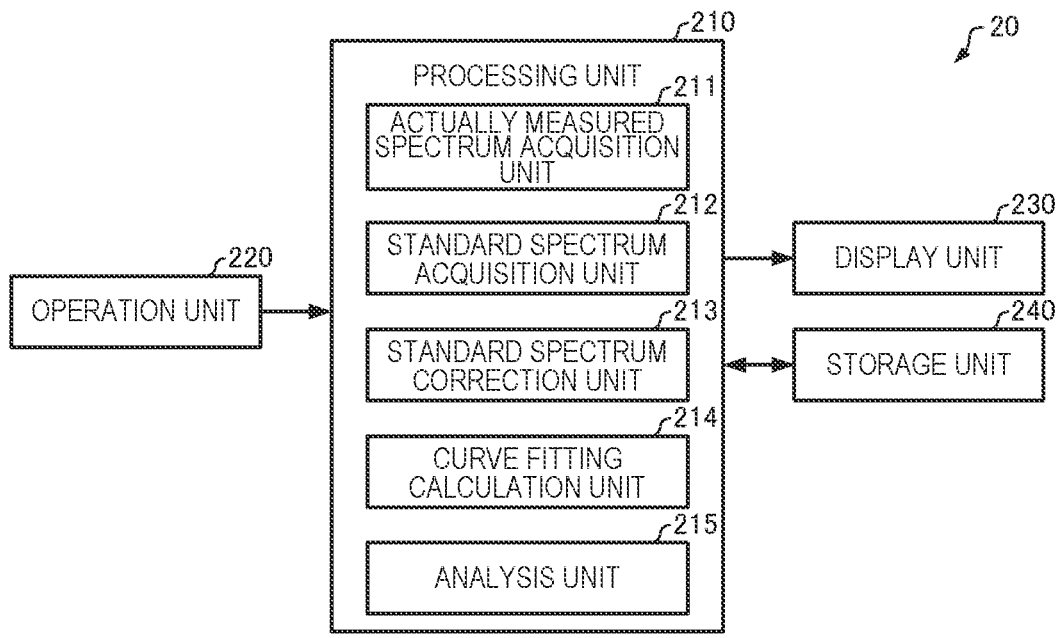
FIG. 2 is a diagram illustrating a configuration of an information processing device of an Auger electron microscope according to an embodiment of the invention.

FIG. 2 is a diagram illustrating a configuration of the information processing device 20. The information processing device 20 performs analysis of the Auger spectrum obtained by the measuring unit 10 illustrated in FIG. 2. The information processing device 20 includes a processing unit 210, an operation unit 220, a display unit 230, and a storage unit 240.

The operation unit 220 is for a user to input operation information and outputs the input operation information to the processing unit 210. The function of the operation unit 220 can be realized by hardware such as a keyboard, a mouse, a button, a touch panel, and a touch pad.

The display unit 230 displays an image generated by the processing unit 210. The function of the display unit 230 can be realized by a liquid crystal display (LCD), a touch panel that also functions as the operation unit 220, or the like.

The storage unit 240 stores programs and various data for operating a computer as each unit of the processing unit 210. The storage unit 240 also functions as a work region of the processing unit 210. The function of the storage unit 240 can be realized by a hard disk, a random access memory (RAM), or the like.

The storage unit 240 stores a database of standard Auger spectra (an example of first standard Auger spectra). The standard Auger spectra are Auger spectra obtained by measuring a standard specimen whose chemical state and amount are known. In the database, a plurality of standard Auger spectra obtained by measuring a plurality of standard specimens containing analysis target elements having different chemical states for each analysis target element are registered. Further, in the database, measurement conditions when the standard Auger spectra are measured are registered in association with each of the standard Auger spectra.

Further, the storage unit 240 stores the Auger spectra obtained by measuring the specimen S in the measuring unit 10. Also, the storage unit 240 stores information on the measurement conditions of the Auger spectra measured by the measuring unit 10.

The function of the processing unit 210 can be realized by executing a program with hardware such as various processors (a central processing unit (CPU), a digital signal processor (DSP), etc.). The processing unit 210 includes an actually measured spectrum acquisition unit 211, a standard spectrum acquisition unit 212, a standard spectrum correction unit 213, a curve fitting calculation unit 214, and an analysis unit 215.

The actually measured spectrum acquisition unit 211 acquires actually measured Auger spectra. The actually measured Auger spectra are Auger spectra obtained by measuring a test specimen containing an analysis target element. In addition, the actually measured spectrum acquisition unit 211 acquires a test specimen measurement condition, which are measurement conditions of the test specimen. The actually measured spectrum acquisition unit 211 acquires the actually measured Auger spectra by reading the actually measured Auger spectra, which are analysis targets, out of the storage unit 240.

The standard spectrum acquisition unit 212 acquires the plurality of standard Auger spectra obtained by measuring the plurality of standard specimens containing the analysis target elements having different chemical states from each other. The standard spectrum acquisition unit 212 acquires the plurality of standard Auger spectra by reading the plurality of standard Auger spectra for the analysis target elements from the database stored in the storage unit 240. In this case, the standard spectrum acquisition unit 212 also acquires information on the standard specimen measurement conditions, which are the measurement conditions of each standard specimen from the database stored in the storage unit 240.

The standard spectrum correction unit 213 calculates standard Auger spectra under a plurality of a test specimen measurement condition, that is, a plurality of pseudo standard Auger spectra (an example of second standard Auger spectra) from the plurality of standard Auger spectra acquired by the standard spectrum acquisition unit 212 based on the test specimen measurement condition and the standard specimen measurement conditions. That is, the Auger spectra that should be obtained under the same measurement conditions as the measurement conditions of the actually measured Auger spectra are calculated from the standard Auger spectra obtained under different measurement conditions from the actually measured Auger spectra. As a result, the plurality of pseudo standard Auger spectra can be obtained from the plurality of standard Auger spectra acquired by the standard spectrum acquisition unit 212.

The curve fitting calculation unit 214 performs curve fitting calculation of the actually measured Auger spectra using the plurality of pseudo standard Auger spectra calculated by the standard spectrum correction unit 213. In the curve fitting calculation, a coefficient when a residual between a plurality of addition spectra obtained by multiplying each of the plurality of pseudo standard Auger spectra by a coefficient and the actually measured Auger spectra gives the minimum is obtained. Also, details of the curve fitting calculation will be described later.

The analysis unit 215 analyzes the chemical state of the analysis target element based on results of the curve fitting calculation in the curve fitting calculation unit 214. For example, the analysis unit 215 obtains an abundance ratio and an atomic concentration of the analysis target element for each chemical state based on a plurality of coefficients obtained by the curve fitting calculation.

2. Curve Fitting Calculation

Next, the curve fitting calculation will be described. The Auger spectra used in the following description are all differential spectra. This is for reducing an influence of a background when the curve fitting calculation is performed. Also, as a method for reducing the influence of the background, other methods can be used, and it is not always necessary to use the differential spectra.

Further, hereinafter, the Auger spectra from the standard specimens and the test specimen used for the curve fitting calculation are all data measured under the same measurement conditions. Here, the curve fitting calculation performs the least squares fitting of spectra and aims to solve the following determinant equation (1).

$$\begin{pmatrix} M_1 \\ M_2 \\ \vdots \\ M_n \end{pmatrix} = \begin{pmatrix} S1_1 & S2_1 & \cdots & Sm_1 \\ S1_2 & S2_2 & \cdots & Sm_2 \\ \vdots & \vdots & \ddots & \vdots \\ S1_n & S2_n & \cdots & Sm_n \end{pmatrix} \begin{pmatrix} a_1 \\ a_2 \\ \vdots \\ a_m \end{pmatrix} + \begin{pmatrix} b \\ b \\ \vdots \\ b \end{pmatrix} \quad (1)$$

Energy widths of the spectra used for the curve fitting are divided into n points. The left side of the equation (1) is y components of the spectra from the test specimen (Auger electron intensities), and the right side is an aggregate matrix of y components of the spectra (S1 to Sm) from the corresponding standard specimens. Here, $a_1, a_2, \ldots,$ and $a_m$ are the coefficients of each standard spectra, and b is a constant vector. The residual ε is obtained by subtracting the right side from the left side of the equation (1), and as shown in the equation (2), the coefficient a and the constant b that minimize the residual are calculated.

$$\varepsilon^2 = |M - (S^*a + b)|^2 \quad (2)$$

Since it is clear that $\varepsilon^2$ always has a positive value, this equation is partially differentiated with $a_1, a_2, \ldots,$ and $a_m$, and the point at which the partially differentiated value becomes 0 is the minimum residual. Therefore, when a solution of the equation is obtained to satisfy the following equation, the coefficient a and the constant b of the spectra from each standard specimen can be obtained.

$$\frac{\partial \varepsilon^2}{\partial a_1} = 0, \frac{\partial \varepsilon^2}{\partial a_2} = 0, \ldots, \frac{\partial \varepsilon^2}{\partial a_m} = 0, \frac{\partial \varepsilon^2}{\partial b} = 0 \quad (3)$$

By solving these partial differential equations, the coefficients $a_1, a_2, \ldots,$ and $a_m$ and the constant b of each of the standard spectra can be obtained. However, as a condition, the solution is obtained by adding the condition that $a_1, a_2, \ldots,$ and $a_m$ are all positive numbers. In this way, peak separation is performed using the least squares method.

The coefficients $a_1, a_2, \ldots,$ and $a_m$ of each of the standard spectra thus obtained correspond to the abundance ratio for each chemical state in the test specimen. Also, when the curve fitting calculation is actually performed, it is preferable to use the least squares method with non-negative constraint conditions in consideration of peak shift and the like.

As described above, the coefficients $a_1, a_2, \ldots,$ and $a_m$ of each of the standard spectra correspond to the abundance ratio of each molecule, that is, the abundance ratio of the chemical state. Moreover, the abundance ratio of each molecule can be converted into the atomic concentration from a stoichiometric ratio. For that reason, quantitative analysis is possible by performing the curve fitting calculation of the Auger spectra using the above method.

As an example of the curve fitting calculation, a case in which a red rust specimen is used as the test specimen will be described.

The curve fitting calculation was performed with standard Auger spectra of Fe, standard Auger spectra of FeO, and standard Auger spectra of $Fe_2O_3$ with respect to actually measured Auger spectra obtained by measuring the red rust specimen. In addition, the standard Auger spectra of Fe, the standard Auger spectra of FeO, and the standard Auger spectra of $Fe_2O_3$ were obtained under the same measurement conditions as the actually measured Auger spectra.

Figures 3, 4:
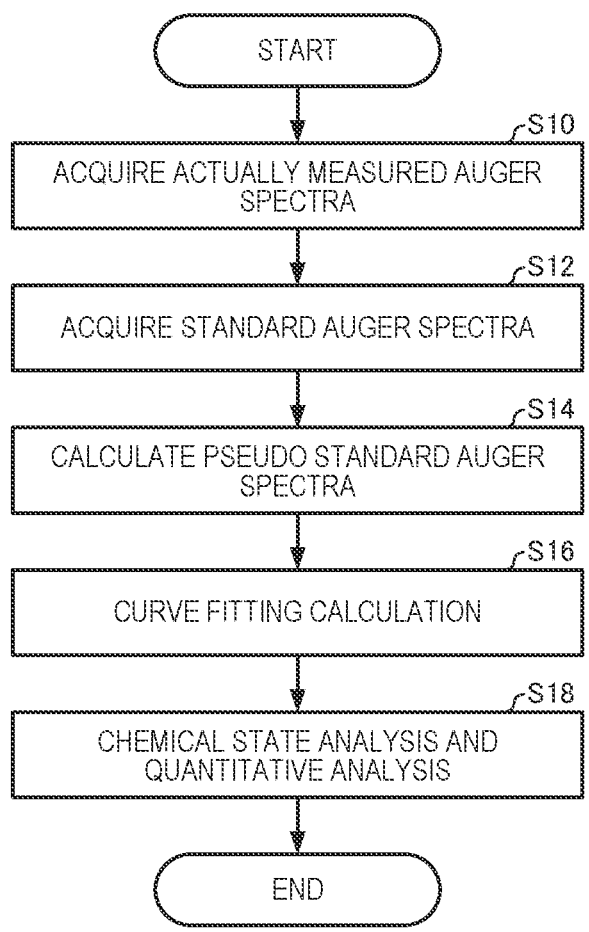
FIG. 3 is a table illustrating results of curve fitting calculation on an Auger spectrum obtained by measuring a red rust specimen.
FIG. 4 is a flowchart illustrating an example of processing of a processing unit of an Auger electron microscope according to an embodiment of the invention.

FIG. 3 is a table illustrating results of the curve fitting calculation on the Auger spectra obtained by measuring the red rust specimen.

FIG. 3 illustrates an absolute intensity ratio of each of the standard Auger spectra included in the Auger spectra of the red rust specimen and an atomic concentration obtained from the absolute intensity ratio. The absolute intensity ratio is an absolute intensity ratio between an intensity of the Auger spectra of each of the standard specimens included in the Auger spectra of the red rust specimen and an intensity of original Auger spectra of each of the standard specimens. The table in FIG. 3 illustrates the absolute intensity ratio of Fe, the absolute intensity ratio of FeO, and the absolute intensity ratio of $Fe_2O_3$.

The absolute intensity ratio corresponds to the abundance ratio of each molecule, that is, the abundance ratio of the chemical state. Moreover, the abundance ratio of each molecule can be converted into the atomic concentration from the stoichiometric ratio. The table in FIG. 3 illustrates an atomic concentration of Fe, an atomic concentration of $Fe^{2+}$, an atomic concentration of $Fe^{3+}$, and an atomic concentration of $O^{2-}$ obtained from the absolute intensity ratio of Fe, the absolute intensity ratio of FeO, and the absolute intensity ratio of $Fe_2O_3$.

The absolute intensity ratio corresponds to the coefficient of each of the standard spectra obtained as a result of performing the above curve fitting calculation. Therefore, quantitative analysis is possible by performing the above curve fitting calculation.

Here, in the above, the Auger spectra from the standard specimens and the test specimen used for the curve fitting calculation have been described as the data measured under the same measurement conditions, but in the present embodiment, the pseudo standard Auger spectra are used as the Auger spectra from the standard specimens used for the curve fitting calculation. Even in a case in which the pseudo standard Auger spectra are used, the curve fitting calculation can be performed in the same manner as in the case in which the standard Auger spectra under the same measurement conditions are used, and the same results can be obtained.

By using the pseudo standard Auger spectra, the curve fitting calculation is possible even if the measurement conditions of the standard Auger spectra and the measurement conditions of the actually measured Auger spectra are different. Therefore, for example, as the standard Auger spectra, it is possible to use spectra measured by an Auger electron microscope different from the Auger electron microscope that measured the actually measured Auger spectra.

3. Calculation of Pseudo Standard Auger Spectra

Next, a method for calculating the pseudo standard Auger spectra will be described. In the present embodiment, the pseudo standard Auger spectra are calculated from the standard Auger spectra under the standard specimen measurement conditions based on the test specimen measurement condition and the standard specimen measurement conditions.

The measurement conditions for acquiring the Auger spectra include acceleration voltage conditions, irradiation current conditions, electron beam dwell time conditions, specimen tilt angle conditions, spectrum integration frequency conditions, and energy step conditions. Further, when the differential spectra are used for the curve fitting calculation, the measurement conditions include the number of differential points.

3.1. Acceleration Voltage

The acceleration voltage is a voltage for accelerating electrons in an Auger electron microscope. When the pseudo standard Auger spectra are calculated, by multiply the standard Auger spectra by an acceleration voltage correction coefficient, a difference in peak intensity originated from a difference in acceleration voltage as compared to the actually measured Auger spectra is corrected.

The acceleration voltage correction coefficient can be obtained based on conditions of the acceleration voltage of the actually measured Auger spectra and conditions of the acceleration voltage of the standard Auger spectra. For example, from an ionization cross-section area equation (for example, Gryzinsk's equation), a difference in peak intensity of the analysis target element in accordance with a difference in acceleration voltage is obtained, and the acceleration voltage correction coefficient is obtained.

3.2. Irradiation Current

The irradiation current is an amount of current flowing through an electron probe with which a specimen is irradiated. When the pseudo standard Auger spectra are calculated, by multiplying the standard Auger spectra by an irradiation current correction coefficient, a difference in peak intensity originated from a difference in irradiation current as compared to the actually measured Auger spectra is corrected.

The irradiation current correction coefficient can be obtained based on conditions of the irradiation current of the actually measured Auger spectra and conditions of the irradiation current of the standard Auger spectra. Since a peak intensity of the Auger spectra is proportional to an amount of irradiation current, the irradiation current correction coefficient can be obtained by comparing an amount of irradiation current of the actually measured Auger spectra with an amount of irradiation current of the standard Auger spectra.

3.3. Electron Beam Dwell Time

The electron beam dwell time is a time that an electron beam dwells in one measurement region. When the pseudo standard Auger spectra are calculated, by multiplying the standard Auger spectra by a dwell time correction coefficient, a difference in peak intensity originated from a difference in dwell time as compared to the actually measured Auger spectra is corrected.

The dwell time correction coefficient can be obtained based on conditions of the dwell time of the actually measured Auger spectra and conditions of the dwell time of the standard Auger spectra. Since the peak intensity of the Auger spectra is proportional to the dwell time of the electron beam, the dwell time correction coefficient can be obtained by comparing the dwell time of the actually measured Auger spectra with the dwell time of the standard Auger spectra.

3.4. Specimen Tilt Angle

The specimen tilt angle is a tilt angle of a specimen stage. When the pseudo standard Auger spectra are calculated, by multiplying the standard Auger spectra by a specimen tilt angle correction coefficient, a difference in peak intensity originated from a difference in specimen tilt angle as compared to the actually measured Auger spectra is corrected.

The specimen tilt angle correction coefficient can be obtained based on conditions of the specimen tilt angle in the actually measured Auger spectra and conditions of the specimen tilt angle in the standard Auger spectra. For example, in a case in which an angle $\Phi$ between an incident angle of an electron beam and a detector is $\Phi=60$ degrees, when a detection amount when the specimen tilt angle is 0 degrees is defined as $I_0$, and a detection amount when the specimen tilt angle is $\theta$ is defined as $I_\theta$, an intensity ratio of $I_\theta/I_0$ when the tilt angle is 0 degrees and when the specimen tilt angle is $\theta$ is expressed by the following equation.

$$\frac{I_\theta}{I_0} = \sqrt{3}\tan\theta + 1$$

By using the above equation, the specimen tilt angle correction coefficient can be obtained.

3.5. Integration Frequency

The integration frequency is the number of integrations of spectra. When the pseudo standard Auger spectra are calculated, by multiplying the standard Auger spectra by an integration frequency correction coefficient, a difference in peak intensity originated from a difference in integration frequency as compared to the actually measured Auger spectra is corrected.

The integration frequency correction coefficient can be obtained based on conditions for the integration frequency of the actually measured Auger spectra and conditions for the integration frequency of the standard Auger spectra. Since the peak intensity of the Auger spectra is proportional to the integration frequency, the integration frequency correction coefficient can be obtained by comparing the integration frequency of the actually measured Auger spectra with the integration frequency of the standard Auger spectra.

3.6. Measurement Energy Step

The measurement energy step is a measurement interval of the Auger spectra and an interval of an energy axis of the Auger spectra. For correction of the measurement energy step, first, a difference between the measurement energy step of the actually measured Auger spectra and the measurement energy step of the standard Auger spectra is obtained. In a case in which the difference between the energy steps is present, the measured energy step of the standard Auger spectra is caused to coincide with the measured energy step of the actually measured Auger spectra by using linear interpolation or the like.

3.7. Number of Differential Points

In a case in which the Auger spectra are differentiated using the Savitzky Golay method or the like to obtain differential Auger spectra, when the number of differential points differs, a degree of smoothing differs, and thus a difference in peak intensity occurs. For that reason, when the standard Auger spectra are differentiated, the differentiation is performed with the same number of differential points as when the actually measured Auger spectra are differentiated. In addition, before the standard Auger spectra are differentiated, correction of the measurement energy step described above is performed to cause the measurement energy steps of the actually measured Auger spectra and the standard Auger spectra to coincide with each other.

In a case in which correction of the number of differential points is performed, the standard Auger spectra registered in the database is not the differential spectrum, but the spectra before differentiation, that is, the spectra before the background is removed.

3.8. Correction Method

In a case in which the standard Auger spectra are corrected to obtain the pseudo standard Auger spectra, first, as described in "3.6. Measurement Energy Step", the measurement energy step of the standard Auger spectra and the measurement energy step of the actually measured Auger spectra are caused to coincide with each other. Next, as described in "3.7. Number of Differential Points", the standard Auger spectra are differentiated with the same number of differential points as the number of differential points when the actually measured Auger spectra are differentiated, and the differential standard Auger spectra are obtained. The differential standard Auger spectra obtained in this way are multiplied by the acceleration voltage correction coefficient, the irradiation current correction coefficient, the dwell time correction coefficient, the specimen tilt angle correction coefficient, and the integration frequency correction coefficient. This makes it possible to calculate the pseudo standard Auger spectra.

As mentioned above, the pseudo standard Auger spectra are in a differential waveform. Therefore, in the present embodiment, the curve fitting calculation can be performed by using the differential spectra of the pseudo standard Auger spectra with respect to the differential spectra of the standard Auger spectra. For that reason, the influence of the background can be reduced in the curve fitting calculation.

Further, in a case in which the measurement conditions of the standard Auger spectra and the measurement conditions of the actually measured Auger spectra are the same, the speed voltage correction coefficient, the irradiation current correction coefficient, the dwell time correction coefficient, the specimen tilt angle correction coefficient, and the integration frequency correction coefficient are 1, and the measurement energy step and the number of differential points are not corrected. That is, the pseudo standard Auger spectra and the standard Auger spectra coincide with each other.

4. Processing

FIG. 4 is a flowchart illustrating an example of processing of the processing unit 210 of the Auger electron microscope 100. Here, a case in which the analysis target element is Sn will be described.

The measuring unit 10 measures the test specimen containing Sn. As a result, the actually measured Auger spectra of the test specimen can be obtained. For example, when the measuring unit 10 performs measurement of the test specimen, information on the actually measured Auger spectra is sent from the measuring unit 10 to the information processing device 20 and stored in the storage unit 240. Further, the test specimen measurement condition, which are the measurement conditions of the test specimen, are sent from the control device that controls each unit of the measuring unit 10 and stored in the storage unit 240.

When the user inputs an instruction to start the analysis of the actually measured Auger spectra using the operation unit 220, the actually measured spectrum acquisition unit 211 reads the actually measured Auger spectra of the test specimen serving as the analysis target from the storage unit 240 and acquires the actually measured Auger spectra (S10).

The actually measured spectrum acquisition unit 211 acquires information on the test specimen measurement condition, which are the measurement conditions for the test specimen from the storage unit 240 as well as the actually measured Auger spectra. Also, the actually measured spectrum acquisition unit 211 may acquire the measurement conditions input by the user via the operation unit 220 as the test specimen measurement condition.

Figure 5:
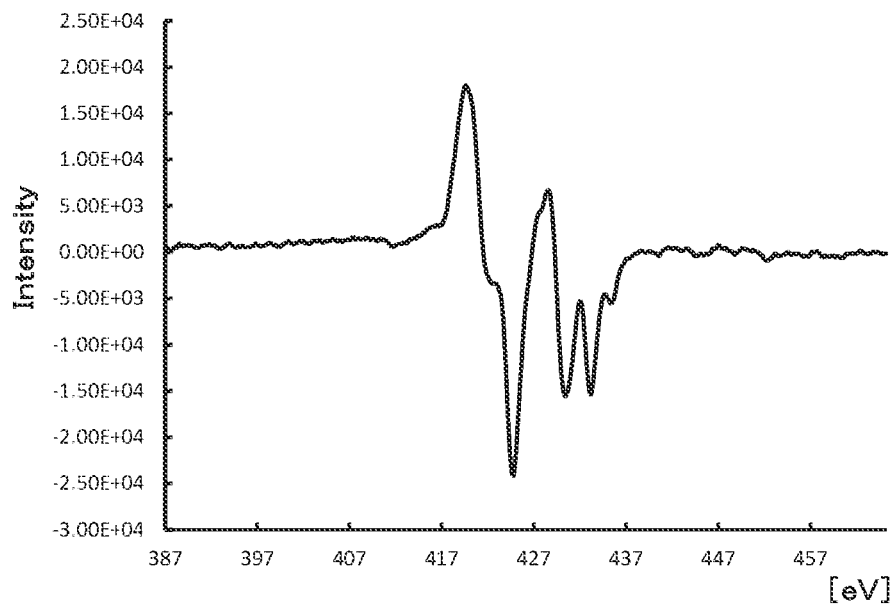
FIG. 5 is a diagram illustrating an actually measured Auger spectrum of a test specimen.

FIG. 5 is a diagram illustrating an actually measured Auger spectra M of the test specimen.

The actually measured spectrum acquisition unit 211 displays the actually measured Auger spectra M on the display unit 230 that has been acquired.

Next, the standard spectrum acquisition unit 212 acquires the plurality of standard Auger spectra obtained by measuring the plurality of standard specimens containing the analysis target elements having different chemical bond states from each other from the database stored in the storage unit 240 (S12).

In addition, the standard spectrum acquisition unit 212 also acquires information on the standard specimen measurement conditions, which are the measurement conditions for each of the plurality of standard Auger spectra from the database.

Specifically, the standard spectrum acquisition unit 212 acquires standard Auger spectra of Sn obtained by measuring a standard specimen of Sn, standard Auger spectra of SnO obtained by measuring a standard specimen of SnO, and standard Auger spectra of $SnO_2$ obtained by measuring a standard specimen of $SnO_2$. Further, the standard spectrum acquisition unit 212 acquires measurement conditions of the standard specimen of Sn, measurement conditions of the standard specimen of SnO, and measurement conditions of the standard specimen of $SnO_2$.

Next, the standard spectrum correction unit 213 calculates the standard Auger spectra (pseudo standard Auger spectra) under the plurality of a test specimen measurement condition from the plurality of standard Auger spectra based on the test specimen measurement condition and the standard specimen measurement conditions (S16).

Specifically, the standard spectrum correction unit 213 calculates the pseudo standard Auger spectra of Sn from the standard Auger spectra of Sn based on the measurement conditions of the test specimen and the measurement conditions of the standard specimen of Sn. The pseudo standard Auger spectra of Sn can be calculated using the method described in "3. Calculation of Pseudo Standard Auger Spectra" described above.

Similarly, the standard spectrum correction unit 213 calculates the pseudo standard Auger spectra of SnO and the pseudo standard Auger spectra of $SnO_2$.

Figure 6:
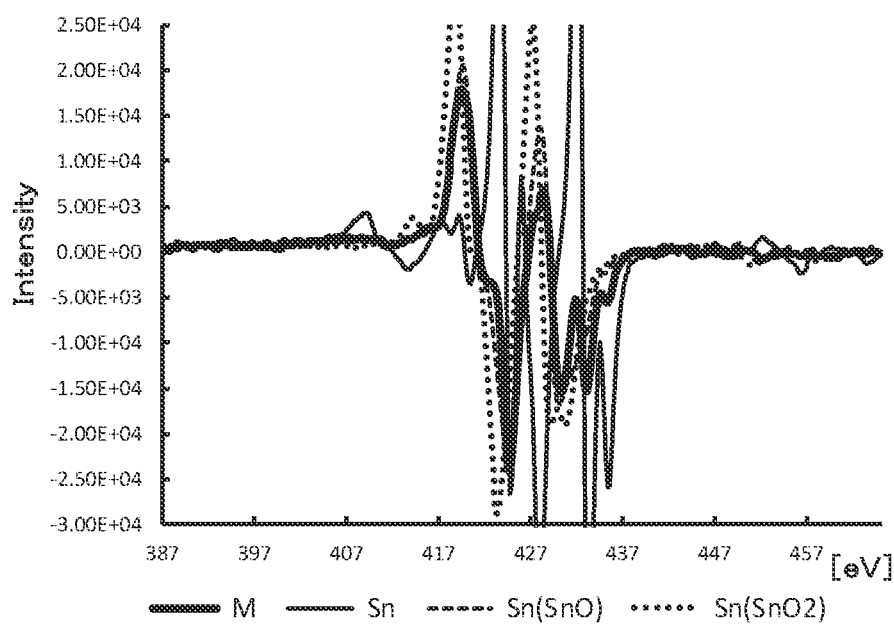
FIG. 6 is a graph illustrating an actually measured Auger spectrum, a Sn pseudo standard Auger spectrum, a SnO pseudo standard Auger spectrum, and a $SnO_2$ pseudo standard Auger spectrum.

FIG. 6 is a graph illustrating the actually measured Auger spectra M, the pseudo standard Auger spectra Sn of Sn, the pseudo standard Auger spectra Sn (SnO) of SnO, and the pseudo standard Auger spectra Sn (SnO2) of $SnO_2$.

The standard spectrum correction unit 213 causes the display unit 230 to display the pseudo standard Auger spectra Sn of Sn, the pseudo standard Auger spectra Sn (SnO) of SnO, and the pseudo standard Auger spectra Sn (SnO2) of $SnO_2$ that have been calculated.

The curve fitting calculation unit 214 performs curve fitting calculation of the actually measured Auger spectra using the calculated plurality of pseudo standard Auger spectra (S16).

The curve fitting calculation is performed using the method described in "2. Curve Fitting Calculation" described above. Specifically, the curve fitting calculation unit 214 obtains each coefficient when the residual between the plurality of addition spectra obtained by multiplying each of the pseudo standard Auger spectra Sn of Sn, the pseudo standard Auger spectra Sn (SnO) of SnO, and the pseudo standard Auger spectra Sn (SnO2) of $SnO_2$ by the coefficient and the actually measured Auger spectra M gives the minimum.

Figures 7, 8:
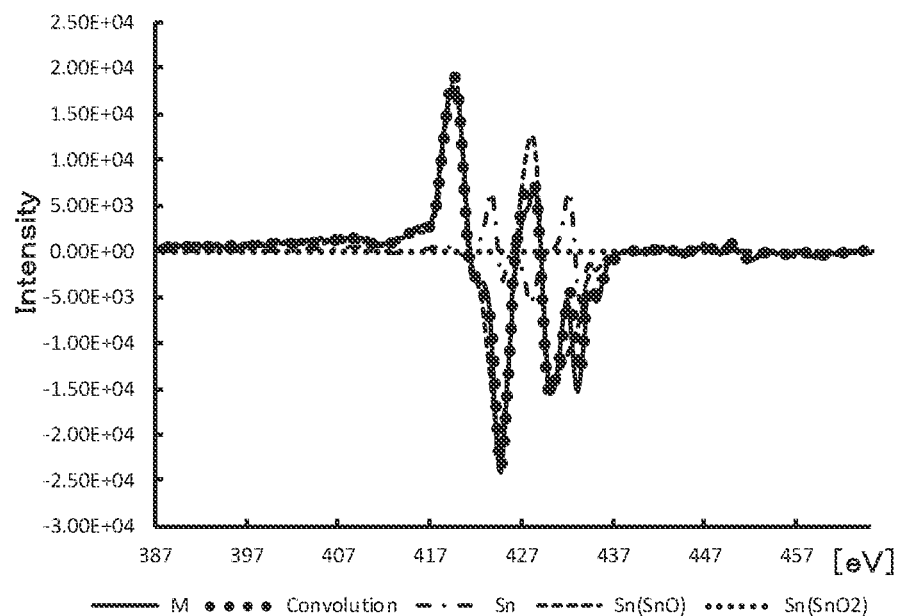
FIG. 7 is a graph illustrating results of curve fitting calculation.
FIG. 8 is a table illustrating results of quantitative analysis.

FIG. 7 is a graph illustrating results of the curve fitting calculation. FIG. 7 illustrates the actually measured Auger spectra M of the test specimen, a function Convolution showing results of the curve fitting, the pseudo standard Auger spectra Sn of Sn, the pseudo standard Auger spectra Sn (SnO) of SnO, and the pseudo standard Auger spectra Sn (SnO2) of $SnO_2$. Also, the pseudo standard Auger spectra Sn of Sn, the pseudo standard Auger spectra Sn (SnO) of SnO, and the pseudo standard Auger spectra Sn (SnO2) of $SnO_2$ in FIG. 7 are each multiplied by the coefficient.

The analysis unit 215 performs chemical state analysis and quantitative analysis based on each coefficient obtained by performing the curve fitting calculation (S18).

The analysis unit 215 obtains the abundance ratio and the atomic concentration for each chemical state from each coefficient by using the method described in "2. Curve Fitting Calculation".

FIG. 8 is a table illustrating results of the quantitative analysis. The analysis unit 215 calculates an atomic concentration of Sn (Atomic %), an atomic concentration of SnO (Atomic %), and an atomic concentration (Atomic %) of $SnO_2$ from the peak intensity ratio Mag. of the pseudo standard Auger spectra Sn of Sn, the pseudo standard Auger spectra Sn (SnO) of SnO, and the pseudo standard Auger spectra Sn (SnO2) of $SnO_2$.

The analysis unit 215 causes the display unit 230 to display the results of analysis illustrated in FIG. 8. Then, the processing unit 210 ends the processing.

5. Operations and Effects

The Auger electron microscope 100 includes the processing unit 210 that performs analysis of the Auger spectra obtained by the measuring unit 10, and the processing unit 210 performs the processing of: acquiring actually measured Auger spectra obtained by measuring a test specimen containing an analysis target element; acquiring a plurality of standard Auger spectra obtained by measuring a plurality of standard specimens containing analysis target elements having different chemical states from each other; calculating a plurality of pseudo standard Auger spectra from the plurality of standard Auger spectra based on a test specimen measurement condition and standard specimen measurement conditions; and performing curve fitting calculation of the actually measured Auger spectra using the plurality of calculated pseudo standard Auger spectra.

As described above, in the Auger electron microscope 100, since the processing unit 210 calculates the standard Auger spectra under the plurality of a test specimen measurement condition from the standard Auger spectra of the plurality of standard specimen measurement conditions, that is, the pseudo standard Auger spectra, the curve fitting calculation can be performed even in a case in which the measurement conditions of the actually measured Auger spectra and the measurement conditions of the standard Auger spectra are different from each other.

In the Auger electron microscope 100, the storage unit 240 stores the standard Auger spectra and the standard specimen measurement conditions in association with each of the plurality of standard Auger spectra. Further, in the process of acquiring the plurality of standard Auger spectra, the plurality of standard Auger spectra and the associated standard specimen measurement conditions are read out from the storage unit 240. For that reason, the Auger electron microscope 100 can easily perform the curve fitting calculation.

In the Auger electron microscope 100, the peak intensity of the standard Auger spectra under the standard specimen measurement conditions is corrected based on the test specimen measurement condition and the standard specimen measurement conditions in the process of calculating the pseudo standard Auger spectra. For that reason, in the Auger electron microscope 100, the curve fitting calculation can be performed even in the case in which the measurement conditions of the actually measured Auger spectra and the measurement conditions of the standard Auger spectra are different from each other.

In the Auger electron microscope 100, the test specimen measurement condition and the standard specimen measurement conditions include at least one of the acceleration voltage conditions, the irradiation current conditions, the electron beam dwell time conditions, the specimen tilt angle conditions, the spectrum integration frequency conditions, and the energy step conditions. For that reason, in the Auger electron microscope 100, the curve fitting calculation can be performed even when these conditions are different between the actually measured Auger spectra and the standard Auger spectra.

In the Auger electron microscope 100, the coefficient when the residual between the plurality of addition spectra obtained by multiplying each of the plurality of pseudo standard Auger spectra by the coefficient and the actually measured Auger spectra gives the minimum is obtained in the process of performing the curve fitting calculation. In addition, the processing unit 210 obtains the abundance ratio of the analysis target element for each chemical state based on the plurality of coefficients obtained by performing the curve fitting calculation. As a result, even when the chemical states of the analysis target element are mixed, proportions of the chemical states of the analysis target element can be obtained.

The analysis method according to the present embodiment includes the steps of: acquiring actually measured Auger spectra obtained by measuring a test specimen containing an analysis target element; acquiring a plurality of standard Auger spectra obtained by measuring a plurality of standard specimens containing analysis target elements having different chemical states from each other; calculating a plurality of pseudo standard Auger spectra from the plurality of standard Auger spectra under a plurality of standard specimen measurement conditions based on a test specimen measurement condition and standard specimen measurement conditions; and performing curve fitting calculation of the actually measured Auger spectra using the plurality of calculated pseudo standard Auger spectra. For that reason, the curve fitting calculation can be performed even in the case in which the measurement conditions of the actually measured Auger spectra and the measurement conditions of the standard Auger spectra are different from each other.

The invention is not limited to the above-described embodiments, and various modifications can be made. For example, the invention includes configurations that are substantially the same as the configurations described in the embodiments. Substantially same configurations means configurations that are the same in function, method, and results, or configurations that are the same in objective and effects, for example. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. An Auger electron microscope comprising:
a measuring unit that performs measurement by Auger electron spectroscopy; and
a processing unit that analyzes Auger spectra obtained by the measuring unit,
the processing unit performing processing of:
acquiring an actually measured Auger spectrum obtained by measuring a test specimen containing an analysis target element;
acquiring a plurality of first standard Auger spectra obtained by measuring a plurality of standard specimens each containing the same analysis target element but in different chemical states;
calculating, based on a test specimen measurement condition that is a measurement condition when the test specimen has been measured and a standard specimen measurement condition that is a measurement condition when the plurality of standard specimens have been measured, a plurality of second standard Auger spectra under the test specimen measurement condition from the plurality of first standard Auger spectra; and
performing a curve fitting calculation of the actually measured Auger spectrum by using the plurality of calculated second standard Auger spectra
wherein in the processing of calculating the plurality of second standard Auger spectra, a peak intensity of the first standard Auger spectra is corrected based on the test specimen measurement condition and the standard specimen measurement condition.

2. The Auger electron microscope according to claim 1, further comprising a storage unit storing each of the plurality of first standard Auger spectra in association with the standard specimen measurement condition.

3. The Auger electron microscope according to claim 2, wherein in the processing of acquiring the plurality of first standard Auger spectra, the plurality of the first standard Auger spectra and the standard specimen measurement condition associated therewith are read out from the storage unit.

4. The Auger electron microscope according to claim 1, wherein each of the test specimen measurement condition and the standard specimen measurement condition comprises at least one of an acceleration voltage condition, an irradiation current condition, an electron beam dwell time condition, a specimen tilt angle condition, a spectrum integration frequency condition, and an energy step condition.

5. The Auger electron microscope according to claim 1, wherein in the processing of performing the curve fitting calculation, when a residual between a plurality of addition spectra obtained by respectively multiplying the plurality of second standard Auger spectra by coefficients and the actually measured Auger spectrum gives a minimum, the coefficients are worked out.

6. The Auger electron microscope according to claim 5, wherein the processing unit performs processing of obtaining an abundance ratio of the analysis target element in different chemical states based on each of the coefficients obtained by performing the curve fitting calculation.

7. An analysis method comprising:
acquiring actually measured Auger spectrum obtained by measuring a test specimen containing an analysis target element;
acquiring a plurality of first standard Auger spectra obtained by measuring a plurality of standard specimens each containing the same analysis target element but in different chemical states;
calculating, based on a test specimen measurement condition that is a measurement condition when the test specimen has been measured and a standard specimen measurement condition that is a measurement condition when the plurality of standard specimens have been measured, a plurality of second standard Auger spectra under the test specimen measurement condition from the plurality of first standard Auger spectra; and
performing a curve fitting calculation of the actually measured Auger spectrum by using the plurality of calculated second standard Auger spectra,
wherein, in calculating the plurality of second standard Auger spectra, a peak intensity of the first standard Auger spectra is corrected based on the test specimen measurement condition and the standard specimen measurement condition.

* * * * *